(12) United States Patent
Shin et al.

(10) Patent No.: US 9,484,924 B2
(45) Date of Patent: Nov. 1, 2016

(54) NEGATIVE CAPACITANCE LOGIC DEVICE, CLOCK GENERATOR INCLUDING THE SAME AND METHOD OF OPERATING CLOCK GENERATOR

(71) Applicants: Min Cheol Shin, Daejeon (KR); Jae Hyun Lee, Daejeon (KR); Doo Hyung Kang, Daejeon (KR); Jun Beom Seo, Daejeon (KR); Woo Jin Jeong, Daejeon (KR)

(72) Inventors: Min Cheol Shin, Daejeon (KR); Jae Hyun Lee, Daejeon (KR); Doo Hyung Kang, Daejeon (KR); Jun Beom Seo, Daejeon (KR); Woo Jin Jeong, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 14/614,884

(22) Filed: Feb. 5, 2015

(65) Prior Publication Data
US 2016/0211849 A1 Jul. 21, 2016

(30) Foreign Application Priority Data
Jan. 19, 2015 (KR) .................. 10-2015-0008700

(51) Int. Cl.
| *H03K 3/315* | (2006.01) |
|---|---|
| *H03L 7/26* | (2006.01) |
| *H03K 19/16* | (2006.01) |
| *H03K 19/0185* | (2006.01) |
| *H03B 15/00* | (2006.01) |
| *H01L 29/66* | (2006.01) |
| *B82Y 25/00* | (2011.01) |
| *H01L 43/02* | (2006.01) |
| *G11C 11/16* | (2006.01) |
| *H01L 43/10* | (2006.01) |

(52) U.S. Cl.
CPC ............ *H03K 19/16* (2013.01); *B82Y 25/00* (2013.01); *G11C 11/16* (2013.01); *H01L 29/66984* (2013.01); *H01L 43/02* (2013.01); *H01L 43/10* (2013.01); *H03B 15/006* (2013.01); *H03K 19/018578* (2013.01); *H03L 7/26* (2013.01)

(58) Field of Classification Search
CPC ...... G11C 11/16; B82Y 25/00; H03K 19/16; H03K 19/018578; H03L 7/26; H03B 15/006; H01L 29/66969; H01L 43/02; H01L 43/10
USPC ............ 365/171, 158; 331/154, 96, 107 T, 331/107 R, 3; 257/421, 295; 360/324.12, 360/324.2, 324.11, 324.1
See application file for complete search history.

(56) References Cited

U.S. PATENT DOCUMENTS

| 2007/0047294 A1* | 3/2007 | Panchula | ............... B82Y 25/00 365/158 |
|---|---|---|---|
| 2010/0195381 A1* | 8/2010 | Karg | ....................... G11C 11/16 365/171 |

\* cited by examiner

*Primary Examiner* — Arnold Kinkead
(74) *Attorney, Agent, or Firm* — Daly, Crowley, Mofford & Durkee, LLP (57) ABSTRACT

A negative capacitance logic device includes a first field effect transistor (FET) and a second FET. The first FET is coupled between a power supply voltage and an output node, and the first FET includes a ferroelectric having a negative capacitance. The second FET is coupled between the output node and a ground voltage, and the second FET includes a ferroelectric having a negative capacitance. The negative capacitance logic differentiates an input voltage applied to an input node to provide an output voltage at the output node.

11 Claims, 10 Drawing Sheets

NEGATIVE CAPACITANCE LOGIC DEVICE, CLOCK GENERATOR INCLUDING THE SAME AND METHOD OF OPERATING CLOCK GENERATOR

CROSS-REFERENCE TO RELATED APPLICATION

This application claims priority under 35 USC §119 to Korean Patent Application No. 10-2015-0008700, filed on Jan. 19, 2015 in the Korean Intellectual Property Office (KIPO), the contents of which are herein incorporated by reference in their entirety.

BACKGROUND

1. Technical Field

Example embodiments relate generally to field effect transistors (FET) using ferroelectric, and more particularly to negative capacitance logic devices, clock generators including the same and methods of operating clock generators.

2. Description of the Related Art

As the fabrication process of the FETs are scaled, it is very important to reduce heat generating in switching operations of the FETs. When the FETs use negative capacitance, sub-threshold swing is smaller than a limited value and high speed operation and high on-state current may be obtained, which is favorable for low-voltage FETs. The FETs including ferroelectric gate are used for memory device instead of conventional FETs.

SUMMARY

Some example embodiments provide a negative capacitance logic device capable of reducing occupied area.

Some example embodiments provide a clock generator including the negative capacitance logic device capable of reducing occupied area.

Some example embodiments provide a method of operating a clock generator.

According to example embodiments, a negative capacitance logic device includes a first field effect transistor (FET) and a second FET. The first FET is coupled between a power supply voltage and an output node, and the first FET includes a ferroelectric having a negative capacitance. The second FET is coupled between the output node and a ground voltage, and the second FET includes a ferroelectric having a negative capacitance. The negative capacitance logic differentiates an input voltage applied to an input node to provide an output voltage at the output node.

In example embodiments, the first FET may include a p-channel FET that has a source region coupled to the power supply voltage, a gate electrode coupled to the input node and a drain region coupled to the output node. The second FET may include an n-channel FET that has a drain region coupled to the power supply voltage, a gate electrode coupled to the input node and a source region coupled to the output node.

Each of the first FET and the second FET may have a hysteresis characteristic in response to a change of the input voltage applied to the gate electrode.

Each of the first FET and the second FET may include a dielectric layer including at least the ferroelectric. The dielectric layer may be formed between the gate electrode and an channel region that is formed between the drain region and the source region in a substrate. The dielectric layer may further include a gate oxide layer and a metal layer which are sequentially interposed between the channel region and the ferroelectric The first FET and the second FET may include a dielectric layer including at least the ferroelectric. The dielectric layer may be formed between the gate electrode and an channel region that is formed between the drain region and the source region in a substrate. The dielectric layer may further include a gate oxide layer which is interposed between the channel region and the ferroelectric.

In example embodiments, the negative capacitance logic device may operate as a Schmitt-trigger inverter.

According to example embodiments, a clock generator include a spin torque oscillator and a negative capacitance logic device. The spin torque oscillator generates an oscillating signal having a first frequency in response to an applied direct current. The negative capacitance logic device generates a clock signal toggling with the first frequency, in response to the oscillating signal.

In example embodiments, the spin torque oscillator may include a first free layer, a nonmagnetic layer disposed on the first free layer and a second free layer disposed on the nonmagnetic layer. The second free layer may correspond to the first free layer. The first free layer and the second free layer may have perpendicular magnetic anisotropy or in-plane magnetic anisotropy.

The nonmagnetic layer may be one of a conductive layer and an insulating layer. The first free layer and the second free layer may have the same thickness.

In example embodiments, the spin toque oscillator may include a magnetic tunnel junction (MTJ) structure. The MTJ structure may include a pinned layer, a tunnel layer disposed on the pinned layer and a free layer disposed on the tunnel layer.

In example embodiments, the spin toque oscillator may include a giant magneto resistance (GMR) structure. The GMR structure may include a pinned layer, a nonmagnetic layer disposed on the pinned layer and a free layer disposed in the nonmagnetic layer.

In example embodiments, the negative capacitance logic device includes a first field effect transistor (FET) and a second FET. The first FET is coupled between a power supply voltage and an output node, and the first FET includes a ferroelectric having a negative capacitance. The second FET is coupled between the output node and a ground voltage, and the second FET includes a ferroelectric having a negative capacitance. The negative capacitance logic differentiates the oscillating signal applied to an input node coupled to the spin torque oscillator to provide the clock signal at the output node.

The first FET may include a p-channel FET that has a source region coupled to the power supply voltage, a gate electrode coupled to the input node and a drain region coupled to the output node. The second FET may include an n-channel FET that has a drain region coupled to the power supply voltage, a gate electrode coupled to the input node and a source region coupled to the output node.

Each of the first FET and the second FET may include a dielectric layer including at least the ferroelectric. The dielectric layer may be formed between the gate electrode and an channel region that is formed between the drain region and the source region in a substrate.

According to example embodiments, a method of operating a clock generator including a spin torque oscillator and a negative capacitance logic device, includes applying a direct current to the spin torque oscillator; detecting a change of a resistance of the spin torque oscillator in response to the direct current; generating an oscillating signal corresponding to the change of the resistance; and differentiating the oscillating signal, in the negative capacitance logic device, to generate a clock signal having a first frequency.

Accordingly, logic devices are implemented with FETs including ferroelectrics having negative capacitance, and thus occupied area may be reduced and simple clock generators may be implemented using the logic devices implemented with the FETs having negative capacitance.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
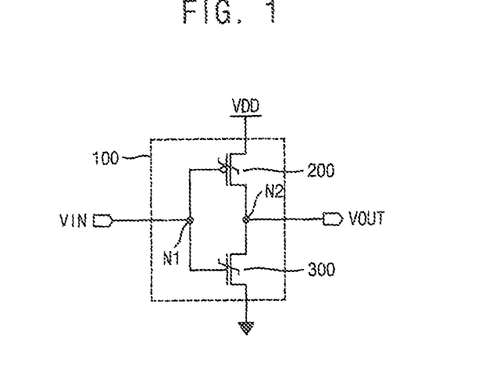
FIG. 1 illustrates a negative capacitance logic device according to example embodiments.

FIG. 1 illustrates a negative capacitance logic device according to example embodiments.

Referring to FIG. 1, a negative capacitance logic device 100 may include a first field effect transistor (FET) 200 and a second FET transistor 300.

The first FET 200 may be coupled between a power supply voltage VDD and an output node N2, and may include a ferroelectric having a negative capacitance. The second FET 300 may be coupled between the output node N2 and a ground voltage, and may include a ferroelectric having a negative capacitance. The negative capacitance logic device 100 may differentiate an input voltage VIN applied to an input node N1 to provide an output voltage VOUT at the output node N2.

In example embodiments, the first FET 200 may include a p-channel FET and the second FET 300 may include an n-channel FET. The first FET 200 may include a source coupled to the power supply voltage VDD, a gate electrode coupled to the input node N1 and a drain coupled to the output node N2. The second FET 300 may include a drain coupled to the output node N2, a gate electrode coupled to the input node N1 and a source coupled to the ground voltage.

Figure 2:
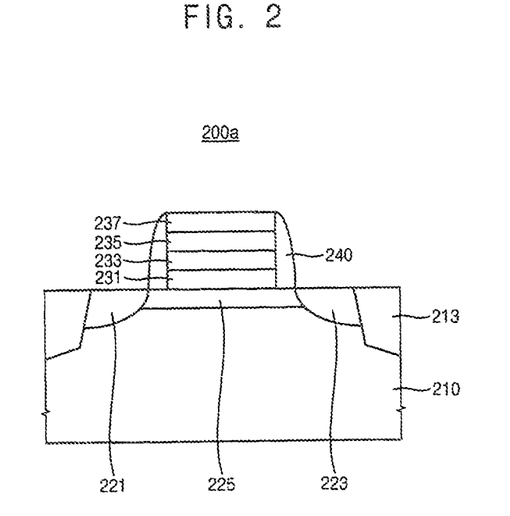
FIG. 2 illustrates an example of the first FET in FIG. 1 according to example embodiments.

FIG. 2 illustrates an example of the first FET in FIG. 1 according to example embodiments.

Referring to FIG. 2, in a first FET 200a, a device isolation region 213 such as shallow trench isolation may be formed in a substrate 210 and impurity regions 221 and 223 may be formed in the substrate 210. The impurity regions 221 and 223 may be served as a source region and a drain region, respectively. A channel region 225 may be formed between the impurity regions 221 and 223 in the substrate 210. A gate oxide layer 231, a metal layer 233 having a positive capacitance, a ferroelectric layer 235 having a negative capacitance and a gate electrode 237 may be sequentially stacked on the channel region 225. Spacers 240 defining the channel region 225 may be formed at both sides of the gate oxide layer 231, the metal layer 233, the ferroelectric layer 235 and the gate electrode 237. The gate oxide layer 231, the metal layer 233 and the ferroelectric layer 235 may be referred to as a dielectric layer. The gate oxide layer 231, the metal layer 233, the ferroelectric layer 235, the gate electrode 237 and the spacers 240 may constitute a gate structure. The ferroelectric layer 235 may be formed by ferroelectric materials such as Peroveskite (BaTiO$_3$, (Ba,Sr)TiO$_3$, Pb(Zr,Ti)O$_3$, Lithium-niobate (LiNbO$_3$), Manganites (YMnO$_3$,ErMnO$_3$)), layer-structure oxides (Bi$_2$WO$_6$, SrBi$_2$Nb$_2$O$_9$), SrBi$_2$Ta$_2$O$_9$, Potassium dihydrogen phosphate (KH$_2$PO$_4$), organic ferroelectric (PVDFTrFE), and HfO$_2$ doped with Si, Al and Zr.

The second FET 300 in FIG. 1 may have a substantially same structure as the second FET 200a of FIG. 2.

Figure 3A:
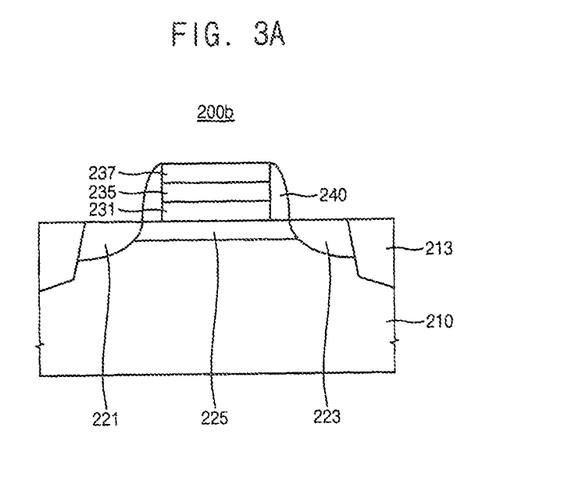
FIG. 3A illustrates an example of the first FET in FIG. 1 according to example embodiments.

FIG. 3A illustrates an example of the first FET in FIG. 1 according to example embodiments.

Referring to FIG. 3A, in a first FET 200b, a device isolation region 213 such as shallow trench isolation may be formed in a substrate 210 and impurity regions 221 and 223 may be formed in the substrate 210. The impurity regions 221 and 223 may be served as a source region and a drain region, respectively. A channel region 225 may be formed between the impurity regions 221 and 223 in the substrate 210. A gate oxide 231, a ferroelectric layer 235 having a negative capacitance and a gate electrode 237 may be sequentially stacked on the channel region 225. Spacers 240 defining the channel region 225 may be formed at both sides of the gate oxide 231, the ferroelectric layer 235 and the gate electrode 237.

The second FET 300 in FIG. 1 may have a substantially same structure as the second FET 200b of FIG. 3A.

Figure 3B:
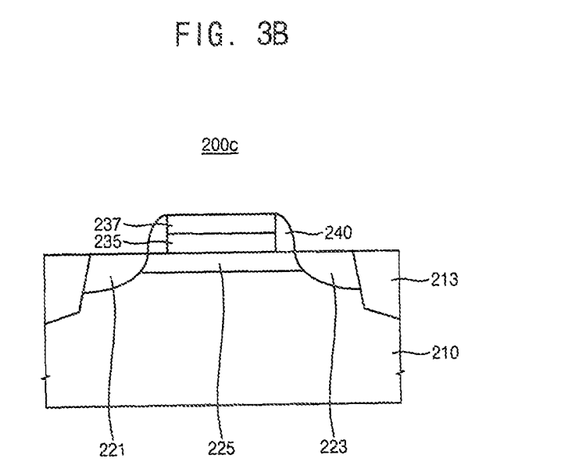
FIG. 3B illustrates an example of the first FET in FIG. 1 according to example embodiments.

FIG. 3B illustrates an example of the first FET in FIG. 1 according to example embodiments.

Referring to FIG. 3B, in a first FET 200c, a device isolation region 213 such as shallow trench isolation may be formed in a substrate 210 and impurity regions 221 and 223 may be formed in the substrate 210. The impurity regions 221 and 223 may be served as a source region and a drain region, respectively. A channel region 225 may be formed between the impurity regions 221 and 223 in the substrate 210. A ferroelectric layer 235 having a negative capacitance and a gate electrode 237 may be sequentially stacked on the channel region 225. Spacers 240 defining the channel region 225 may be formed at both sides of the ferroelectric layer 235 and the gate electrode 237.

The second FET 300 in FIG. 1 may have a substantially same structure as the second FET 200c of FIG. 3B.

Figure 4:
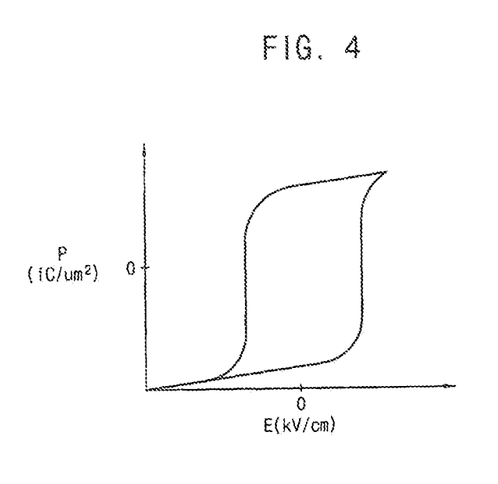
FIG. 4 is a graph illustrating a polarization according to an electric field applied to the ferroelectric layer in the first FET in FIG. 2.

FIG. 4 is a graph illustrating a polarization according to an electric field applied to the ferroelectric layer in the first FET in FIG. 2.

Referring to FIG. 4, it is noted that polarization of the ferroelectric layer 235 shows a hysteresis characteristic according to electric field applied to the ferroelectric layer 235. Since the ferroelectric layer 235 has the polarization showing the hysteresis characteristic, the first FET 200 may have a negative capacitance.

The negative capacitance in ferroelectrics can be understood in terms of a positive feedback mechanism as follows. Suppose we have a (positive) capacitor C0 (per unit area) that sees a terminal voltage equal to the applied voltage V plus a feedback voltage $a_f Q$ proportional to the charge on the capacitor Q (per unit area), such that capacitance Q (per unit area may be expressed by following Equation 1.

$$Q = C_0(V + a_f Q), \quad \text{[Equation 1]}$$

where $a_f$ denotes positive feedback coefficient.

Equation 1 yields Q=C$_{ins}$V, wherein C$_{ins}$ denotes a capacitance of ferroelectric materials, and thus following Equation 2 is produced.

$$C_{ins} = C_0/(1 - a_f C_0) \quad \text{[Equation 2]}$$

In Equation 2, in case of $a_f C_0 > 1$, the ferroelectric materials have a negative capacitance.

Figure 5:
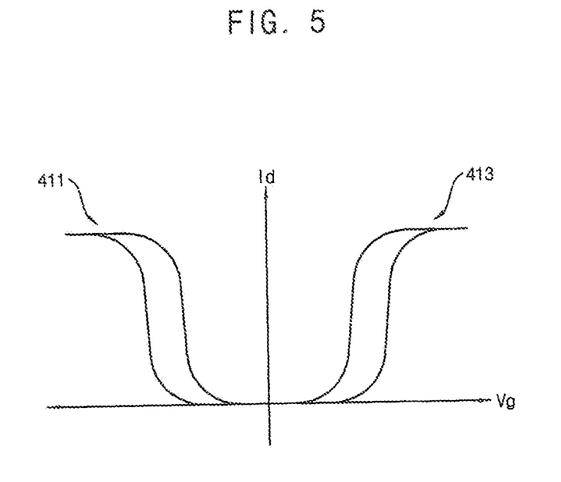
FIG. 5 is a graph illustrating drain currents of the first and second FETs according to gate voltage in the negative capacitance logic device of FIG. 1.

FIG. 5 is a graph illustrating drain currents of the first and second FETs according to gate voltage in the negative capacitance logic device of FIG. 1.

Referring to FIGS. 1 and 5, a reference numeral 411 represents a drain current Id according to a gate voltage Vg of the first FET 200, i.e., the p-channel FET and a reference numeral 413 represents a drain current Id according to a gate voltage Vg of the second FET 300, i.e., the n-channel FET. As is noted in FIG. 5, each of the first and second FETs 200 and 300 provides the drain current Id having a hysteresis characteristic in response to the gate voltage Vg applied to each gate electrode. In addition, the first and second FETs 200 and 300 show hysteresis characteristics symmetric with respect to drain current axis.

Figure 6:
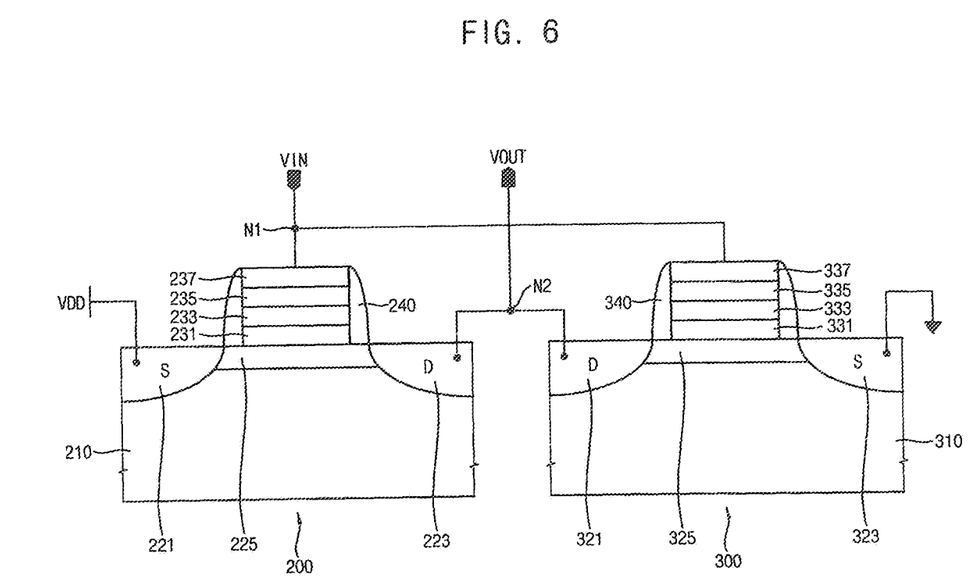
FIG. 6 illustrates a relationship between the first FET, the second FET and voltages in the negative capacitance logic device of FIG. 1 according to example embodiments.

FIG. 6 illustrates a relationship between the first FET, the second FET and voltages in the negative capacitance logic device of FIG. 1 according to example embodiments.

Referring to FIG. 6, in the second FET 300, a device isolation region 313 such as shallow trench isolation may be formed in a substrate 310 and impurity regions 321 and 323 may be formed in the substrate 310. The impurity regions 321 and 323 may be served as a drain region and a source region, respectively. A channel region 325 may be formed between the impurity regions 321 and 323 in the substrate 310. A gate oxide layer 331, a metal layer 333 having a positive capacitance, a ferroelectric layer 335 having a negative capacitance and a gate electrode 337 may be sequentially stacked on the channel region 325. Spacers 340 defining the channel region 325 may be formed at both sides of the gate oxide 331, the metal layer 333, the ferroelectric layer 335 and the gate electrode 337. The gate oxide layer 331, the metal layer 333, the ferroelectric layer 335, the gate electrode 337 and the spacers 340 may constitute a gate structure. The ferroelectric layer 335 may be formed by ferroelectric materials such as Peroveskite (BaTiO$_3$, (Ba,Sr) TiO$_3$, Pb(Zr,Ti)O$_3$, Lithium-niobate (LiNbO$_3$), Manganites (YMnO$_3$,ErMnO$_3$)), layer-structure oxides (Bi$_2$WO$_6$, SrBi$_2$Nb$_2$O$_9$), SrBi$_2$Ta$_2$O$_9$, Potassium dihydrogen phosphate ($KH_2PO_4$), organic ferroelectric (PVDFTrFE), and $HfO_2$ doped with Si, Al and Zr.

The power supply voltage VDD may be coupled to the source region 221 of the first FET 200. The gate electrode 237 of the first FET 200 and the gate electrode 337 of the second FET 300 may be coupled to the first node N1 to which the input voltage VIN is applied. The drain region 223 of the first FET 200 and the drain region 321 of the second FET 300 may be coupled to the second node N2 at which the output voltage VOUT is provided. The ground voltage may be coupled to the source region 323 of the second FET 300.

Since the first FET 200 provides the drain current Id as indicated by the reference numeral 411 in response to the gate voltage Vg and the first FET 300 provides the drain current Id as indicated by the reference numeral 413 in response to the gate voltage Vg, the negative capacitance logic device 100 may operate as a differentiator that differentiates the input voltage VIN to provide the output voltage VOUT. The conventional differentiator includes an operational amplifier, capacitors and resistors and the an operational amplifier includes a plurality of transistors. When the differentiator is implemented with the negative capacitance logic device 100 of FIG. 1, occupied area may be greatly reduced.

Figure 7:
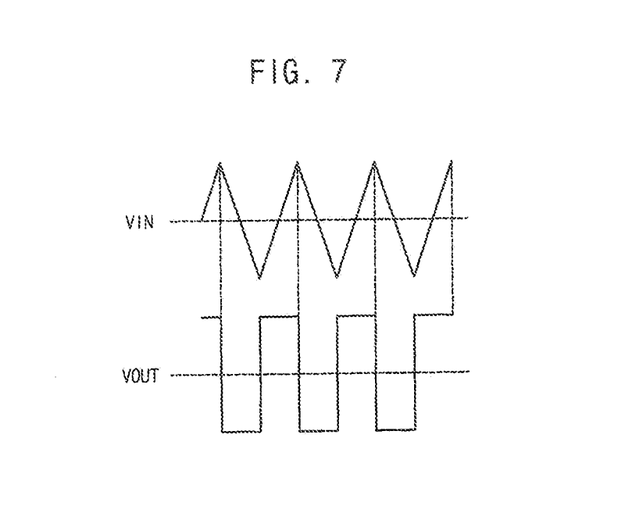
FIG. 7 is a waveform diagram illustrating the input voltage and the output voltage in the negative capacitance logic device of FIG. 1.

FIG. 7 is a waveform diagram illustrating the input voltage and the output voltage in the negative capacitance logic device of FIG. 1.

Referring to FIGS. 1 and 7, when the input voltage VIN is a triangular wave, the output voltage VOUT is a rectangular wave that is obtained by differentiating the triangular wave.

As described above, since the negative capacitance logic device 100 of FIG. 1 has a hysteresis characteristic, the negative capacitance logic device 100 may be employed as a Schmitt-trigger inverter that operates within upper and lower limits. In this case, the Schmitt-trigger inverter includes two FETs having ferroelectric materials, and thus the Schmitt-trigger may have simple architecture and reduced occupied area compared with the conventional Schmitt-trigger inverter that has a plurality of operational amplifiers and a plurality of transistors.

Figure 8:
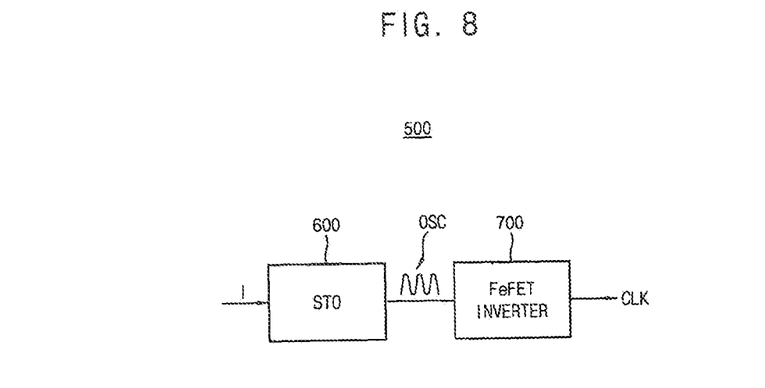
FIG. 8 is a block diagram illustrating a clock generator according to example embodiments.

FIG. 8 is a block diagram illustrating a clock generator according to example embodiments.

Referring to FIG. 8, a clock generator 500 may include a spin torque oscillator (STO) 600 and a negative capacitance logic device having ferroelectrics 700.

The STO 600 may generate an oscillating signal OSC that oscillates with a first frequency, in response to a direct current I. The negative capacitance logic device 700 may receive the oscillating signal OSC, may differentiate the oscillating signal OSC and may output a clock signal CLK toggling with the first frequency. The negative capacitance logic device 700 may employ the negative capacitance logic device 100 of FIG. 1. Therefore, the negative capacitance logic device 600 may include a first FET and a second FET. The first FET may be coupled between a power supply voltage and an output node, and may include a ferroelectric having a negative capacitance. The second FET may be coupled between the output node and a ground voltage, and may include a ferroelectric having a negative capacitance. The negative capacitance logic device 700 may differentiate the oscillating signal OSC applied to the input node to the clock signal CLK at the output node.

Figure 9A:
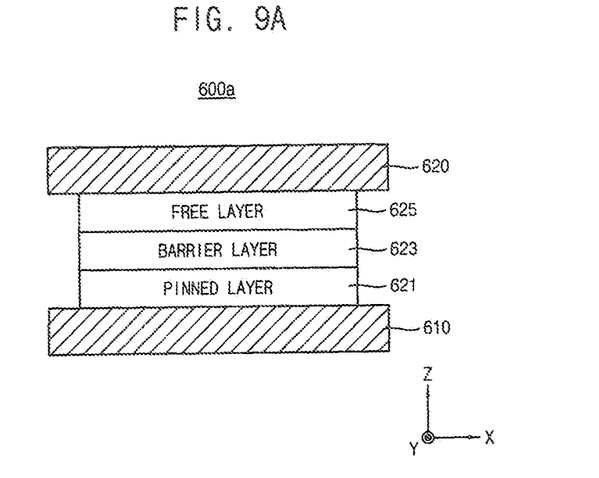
FIG. 9A is an example of a cross-sectional view of the STO in FIG. 8 according to example embodiments.

FIG. 9A is an example of a cross-sectional view of the STO in FIG. 8 according to example embodiments.

Referring to FIG. 9A, an STO 600*a* may include a pinned layer 621, a barrier layer 623 disposed on the pinned layer 621 and a free layer disposed on the barrier layer 625. That is, the STO 600*a* may be implemented with MTJ architecture. The pinned layer 621 has fixed magnetization directions. The pinned layer 621 and the free layer 625 may have ferroelectric materials. A first electrode 610 may be disposed under the pinned layer 621 and a second electrode 625 is disposed on the free layer 625.

Figure 9B:
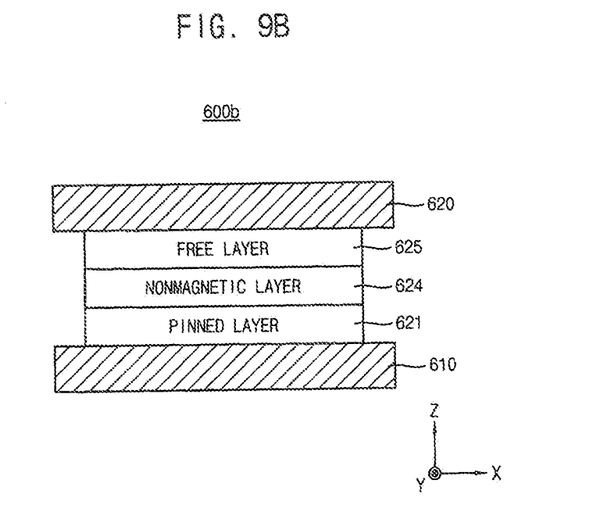
FIG. 9B is another example of a cross-sectional view of the STO in FIG. 8 according to example embodiments.

FIG. 9B is another example of a cross-sectional view of the STO in FIG. 8 according to example embodiments.

Referring to FIG. 9B, an STO 600*b* may include a pinned layer 621, a nonmagnetic layer 624 disposed on the pinned layer 621 and a free layer disposed on the barrier layer 625. That is, the STO 600*b* may be implemented with GMR architecture. The pinned layer 621 has fixed magnetization directions. The pinned layer 621 and the free layer 625 may have ferroelectric materials. The nonmagnetic layer 624 may have nonmagnetic material such as copper. A first electrode 610 may be disposed under the pinned layer 621 and a second electrode 625 is disposed on the free layer 625.

Figure 9C:
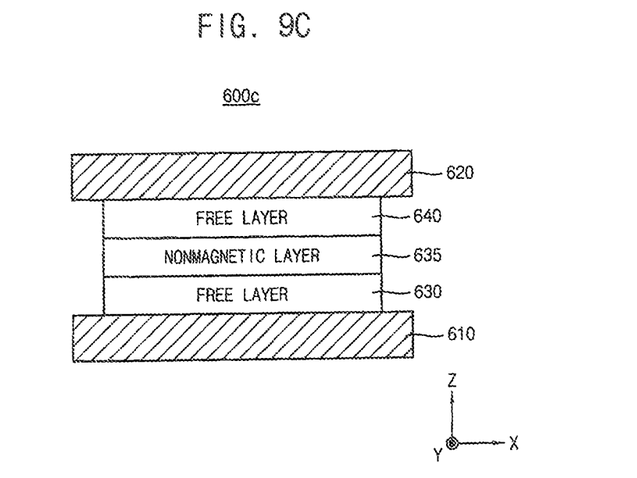
FIG. 9C is another example of a cross-sectional view of the STO in FIG. 8 according to example embodiments.

FIG. 9C is another example of a cross-sectional view of the STO in FIG. 8 according to example embodiments.

Referring to FIG. 9C, an STO 600*c* may include first and second free layers 630 and 640 that are separated from one another by a nonmagnetic layer 634 interposed between the first and second free layers 630 and 640. The first and second free layers 630 and 640 have variable magnetization directions as compared to pinned layers whose magnetization directions are fixed. The first and second free layers 630 and 640 may have perpendicular magnetic anisotropy or in-plane magnetic anisotropy. When the first and second free layers 630 and 640 have perpendicular magnetic anisotropy, the first and second free layers 630 and 640 may be alloy layers formed of an alloy including, for example, cobalt (Co). For example, the alloy layers may include cobalt-platinum (CoPt), cobalt-chromium-platinum (CoCrPt), or the like. Alternatively, the first and second free layers 630 and 640 may have a multi-layer structure in which a layer including at least one of Co and a Co alloy (or similar material) and a layer including at least one of platinum (Pt), nickel (Ni), palladium (Pd) (or similar material) are alternately stacked.

When the first and second free layers 630 and 640 have in-plane magnetic anisotropy, the first and second free layers 630 and 640 may be material layers including, for example, at least one of Co, Ni, iron (Fe), or the like. In one example, the first and second free layers 630 and 640 may include cobalt-iron-boron (CoFeB), nickel iron (NiFe), or the like. However, materials/structures of the first and second free layers 630 and 640 are not limited thereto. For example, the first and second free layers 630 and 640 may be formed of any material for forming a free layer in a general magnetic device. Thicknesses of the first and second free layers 630 and 640 may be between about 1 nm and about 10 nm, inclusive. For example, thicknesses of the first and second free layers 630 and 640 may be between about 1 nm and about 5 nm, inclusive. The thicknesses of the first and second free layers 630 and 640 may be the same, substantially the same or different.

The nonmagnetic layer 635 interposed between the first and second free layers 630 and 640 may be a conductive layer or an insulating layer. For example, the nonmagnetic layer 635 may be a conductive layer including at least one of copper (Cu), aluminium (Al), gold (Au), silver (Ag), any combination thereof or the like. The insulating layer may be a layer including an oxide such as magnesium oxide (MgO), aluminium oxide (AlOx), or the like. The thickness of the nonmagnetic layer 635 may be between about 1 nm and about 3 nm, inclusive.

A first electrode 610 is disposed under the first free layer 630, and a second electrode 620 is disposed on the second free layer 640. The first and second electrodes 610 and 620 may be formed of any electrode material used in general electronic devices. But, structures and sizes of the first and second electrodes 610 and 620 are not limited thereto and may be varied. For example, the first and second electrodes 610 and 620 may be formed having the same or substantially the same widths as the first and second free layers 630 and 640. The first and second electrodes 610 and 620 may be optionally disposed depending on the materials used to form the first and second free layers 630 and 640. For example, when electrical resistances of the first and second free layers 630 and 640 are sufficiently low, the first and second free layers 630 and 640 themselves may be used as electrodes. In this example, the first and second electrodes 610 and 620 may be omitted.

An example of operating the STO in FIG. 9C will now be described with reference to FIGS. 10 and 11.

Figure 10:
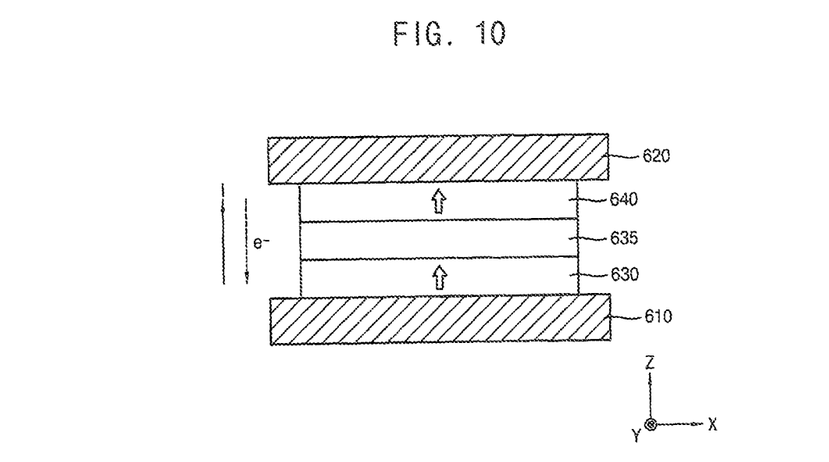
FIG. 10 is a cross-sectional view illustrating the STO of FIG. 9C.

FIG. 10 is a cross-sectional view illustrating the STO of FIG. 9C.

Referring to FIG. 10, the first and second free layers 630 and 640 have perpendicular magnetic anisotropy. In this case, magnetization easy axes of the first and second free layers 630 and 640 are parallel to a Z-axis, and the first and second free layers 630 and 640 are magnetized in a Z-axis direction. Arrows in the first and second free layers 630 and 640 represent magnetization directions thereof. For operating the STO 600c, a current I is applied from one of the first and second electrodes 610 and 620 to the other. In FIG. 10, the current I is applied from the first electrode 610 to the second electrode 620. The current I may be a direct current (DC).

Because the direction of the current I and the direction of an electrons e− are opposite, in this example the electrons e− flow from the second electrode 620 to the first electrode 610. When the electrons e− flow from the second electrode 620 to the first electrode 610 via the second free layer 640 and the first free layer 630, the magnetization directions of the first and second free layers 630 and 640 periodically vary over a given time period.

Figure 11:
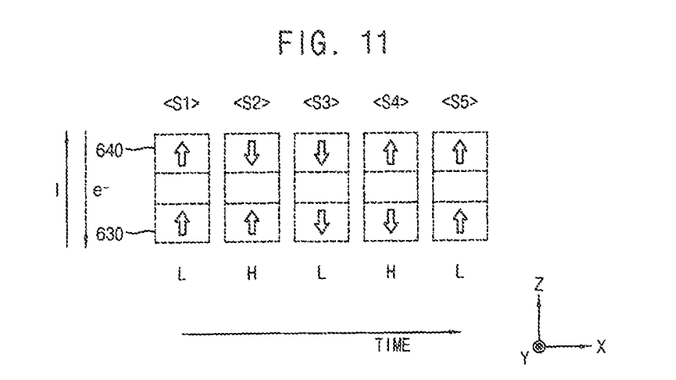
FIG. 11 is a graph illustrating change in magnetization directions of the first and second free layers when a current is applied as illustrated in FIG. 10.

FIG. 11 is a graph illustrating change in magnetization directions of the first and second free layers when a current is applied as illustrated in FIG. 10.

Referring to FIG. 11, the first and second free layers 630 and 640 are magnetized in a positive Z-axis direction at an initial stage, which is referred to as first stage S1. In this case, the first and second free layers 630 and 640 are in a parallel state. If the current I is applied to the first and second free layers 630 and 640, the magnetization direction of the second free layer 640 switches to a reverse Z-axis direction as shown in second stage S2. In the second stage S2, the first and second free layers 630 and 640 are in an anti-parallel state. The magnetization direction of the first free layer 630 then switches to the reverse Z-axis direction as shown in third stage S3. In the third stage S3, the first and second free layers 630 and 640 are in a parallel state.

In a fourth stage S4, the magnetization direction of the second free layer 640 switches to the Z-axis direction, and in a fifth stage S5 the magnetization direction of the first free layer 630 switches to the Z-axis direction. Thus, in the fourth stage S4, the first and second free layers 630 and 640 are in an anti-parallel state, whereas in the fifth stage S5 the first and second free layers 630 and 640 are in a parallel state. In this example, the fifth stage S5 is the same as the first stage S1.

After the fifth stage S5, second through fifth stages S2 to S5 may be repeated. As a result, the magnetization directions of the first and second free layers 630 and 640 may be periodically varied over time by the current I. Thus, according to example embodiments, a parallel state in which the magnetization direction of the first free layer 630 and the magnetization direction of the second free layer 640 are the same, and an anti-parallel state where the magnetization direction of the first free layer 630 and the magnetization direction of the second free layer 640 are opposite to each other is periodic.

When the first and second free layers 630 and 640 are in a parallel state, a resistance of the STO 600c decreases (e.g., to a relative low or relative minimum). But, when the first and second free layers 630 and 640 are in an anti-parallel state, the resistance of the STO 600c increases (e.g., to a relative high or relative maximum). Thus, the resistance of the oscillator in first, second, third, fourth, and fifth stages S1, S2, S3, S4, and S5 may be low L, high H, low L, high H, and low L, respectively, and the resistance of the STO 630c may oscillate by repeating the low L and high H states. In this example, the resistance of the STO 600c refers to an electrical resistance between the first and second electrodes 610 and 620. The STO 600 of FIG. 8 may have a relatively high output power and may generate a signal within a given frequency band.

FIG. 11 shows an example in which magnetization directions Mz of the first and second free layers 630 and 640 may be varied. The magnetization directions of the first and second free layers 630 and 640 are not limited to the example shown in FIG. 11.

Figure 12:
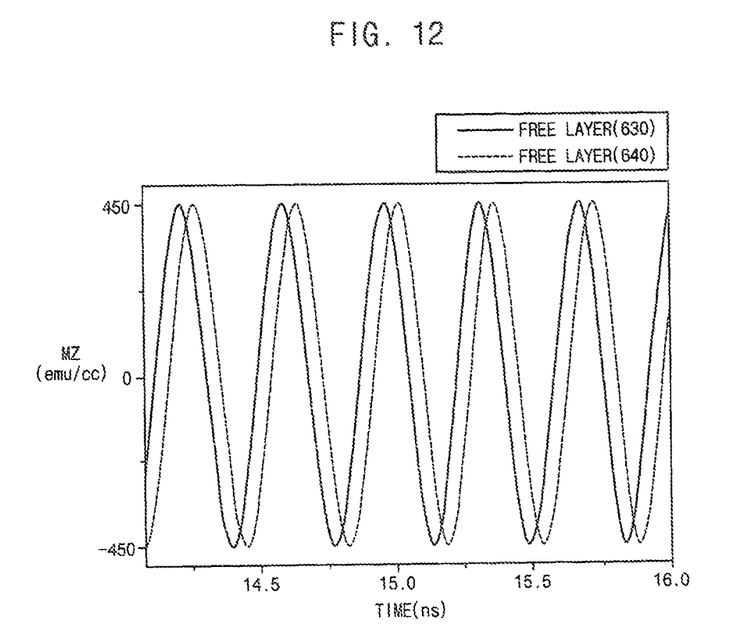
FIG. 12 is a graph illustrating a change in vertical magnetization of the first and second free layers according to time when a current is applied as illustrated in FIG. 10.

FIG. 12 is a graph illustrating a change in vertical magnetization of the first and second free layers according to time when a current is applied as illustrated in FIG. 10.

In this example, the first and second free layers 630 and 640 are CoCrPt layers having perpendicular magnetic anisotropy. In addition, a product "Rp*A" of a resistance Rp of the STO 600c in a parallel state and a cross-sectional area A with respect to an XY plane of the first or second free layer 630 or 640 is about 0.2 $\mu\Omega \cdot cm^2$. A magneto-resistance ratio is about 100%.

Referring to FIG. 12, the amount of vertical magnetization Mz of the first free layer 630 and the amount of vertical magnetization Mz of the second free layer 640 periodically vary between about −450 emu/cc and about 450 emu/cc for a given time interval.

Figure 13:
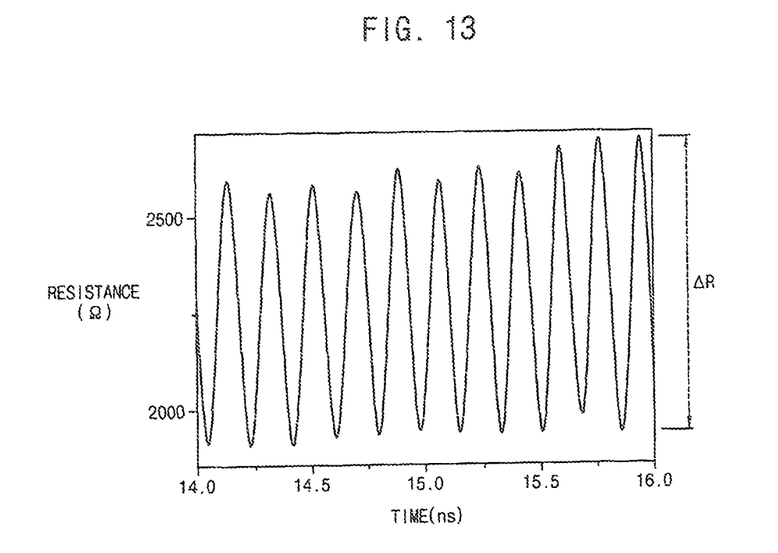
FIG. 13 is a graph showing an example change in the resistance of the STO of FIG. 9C according to time when a current I is applied as illustrated in FIG. 10.

FIG. 13 is a graph showing an example change in the resistance of the STO of FIG. 9C according to time when a current I is applied as illustrated in FIG. 10.

In this example, the change in the resistance of the oscillator refers to a change in the resistance between the first and second electrodes 630 and 640.

Referring to FIG. 13, the resistance of the STO 600c periodically varies thereby generating a signal within a given frequency band. In this case, the amount of resistance change ΔR is about 700Ω. Thus, when a current of about 1 $MA/cm^2$ is applied to the STO 600c of FIG. 9C, an output power thereof may be as high as about 2 μW.

A general oscillator includes a free layer and a pinned layer corresponding to the free layer. In this case, an output power of the general oscillator is as low as about 1 nW, and thus, is relatively difficult to use in various fields. For example, when the pinned layer and the free layer have in-plane magnetic anisotropy, a current (e.g., an alternating current (AC)) and a magnetic field are applied to the oscillator to operate the oscillator. In this case, the structure of the oscillator is relatively complex, and controlling the operation of the oscillator is relatively difficult. Moreover, additional material layers including an anti-ferromagnetic layer are required to fix the magnetization direction of the pinned layer. Thus, the structure of the oscillator is relatively complex and the size thereof increases.

However, according to at least some example embodiments, an STO uses a plurality of free layers to produce relatively high output power. In addition, the STO may be operated using a relatively simple method of applying DC to the STO.

In FIG. 9C, the STO includes two free layers 630 and 640. However, according to at least some example embodiments, STOs may include three or more free layers.

Figure 14:
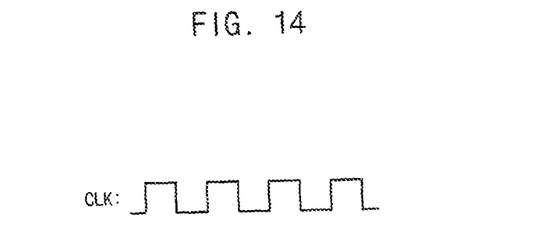
FIG. 14 illustrates an example of the clock signal in the clock generator of FIG. 8 according to example embodiments.

FIG. 14 illustrates an example of the clock signal in the clock generator of FIG. 8 according to example embodiments.

Referring to FIGS. 8 and 14, the negative capacitance logic device 700 may output the clock signal CLK toggling with the first frequency in response to the oscillating signal OSC with the first frequency.

When the STO 600 of FIG. 8 is implemented with array including a plurality of STOs, the first frequency of the clock signal CLK may be selected among oscillating frequencies of the STOs in the array.

Figure 15:
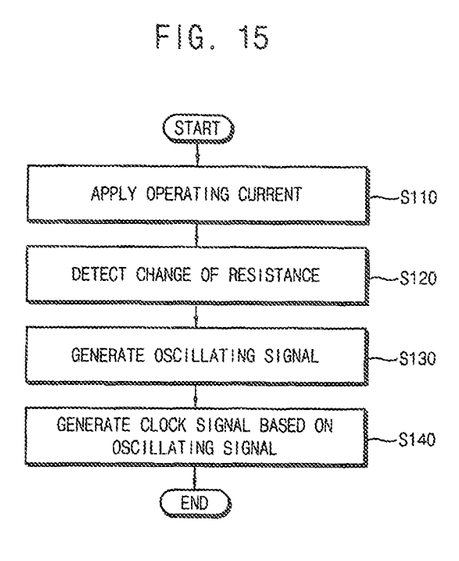
FIG. 15 is a flow chart illustrating a method of operating a clock generator according to example embodiments.

FIG. 15 is a flow chart illustrating a method of operating a clock generator according to example embodiments.

Referring to FIGS. 8 through 15, in a method of operating a clock generator 500 including an STO 600 and a negative capacitance logic device 700, operating current I is applied to the STO 500 (5110). The operating current I may be direct current. The operating current I may be applied between the first and second electrodes 610 and 620 in FIG. 9C. When the first and second electrodes 610 and 620 are omitted, the operating current I may be applied between the free layers 630 and 640. The magnetization directions of the free layers 630 and 640 is repeatedly switched over time in response to the applied current I.

A change in an electrical resistance of the STO 600 is detected while the magnetization directions of the free layers 630 and 640 are repeatedly switched (S120). This change in the electrical resistance of the STO 600 refers to the change in electrical resistance between the first and second electrodes 610 and 620. In this example, the electrical resistance periodically varies as the magnetization directions of the free layers 630 and 640 are switched. Example has been described with reference to FIGS. 11 through 13, and thus, will not be described again.

An oscillating signal OSC having a given frequency is generated due to the change in electrical resistance (S130). The frequency of the oscillating signal OSC generated by the STO 600 may be varied by controlling the current I or the sizes, shapes, and/or properties of the free layers 630 and 640. Clock signal CLK toggling with the given frequency is generated in the negative capacitance logic device 700 by differentiating the oscillating signal OSC (S140).

Example embodiments may be applied to various logic devices and clock generators. That is, example may be applied to differentiators, Schmitt-trigger inverters and clock generators.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A negative capacitance logic device comprising:
   a first field effect transistor (FET) coupled between a power supply voltage and an output node, the first FET including a ferroelectric having a negative capacitance; and
   a second (FET) coupled between the output node and a ground voltage, the second FET including a ferroelectric having a negative capacitance,
   wherein the negative capacitance logic is configured to differentiate an input voltage applied to an input node to provide an output voltage at the output node,
   wherein the first FET includes a p-channel FET that has a source region coupled to the power supply voltage, a gate electrode coupled to the input node and a drain region coupled to the output node,
   wherein the second FET includes an n-channel FET that has a drain region coupled to the power supply voltage, a gate electrode coupled to the input node and a source region coupled to the output node,
   wherein each of the first FET and the second FET includes a dielectric layer including at least the ferroelectric,
   wherein the dielectric layer is formed between the gate electrode and an channel region that is formed between the drain region and the source region in a substrate, and
   wherein the dielectric layer further comprises a gate oxide layer and a metal layer which are sequentially interposed between the channel region and the ferroelectric.

2. The negative capacitance logic device of claim 1, wherein each of the first FET and the second FET has a hysteresis characteristic in response to a change of the input voltage applied to the gate electrode.

3. A negative capacitance logic device comprising:
   a first field effect transistor (FET) coupled between a power supply voltage and an output node, the first FET including a ferroelectric having a negative capacitance; and
   a second (FET) coupled between the output node and a ground voltage, the second FET including a ferroelectric having a negative capacitance,
   wherein the negative capacitance logic is configured to differentiate an input voltage applied to an input node to provide an output voltage at the output node,
   wherein the first FET includes a p-channel FET that has a source region coupled to the power supply voltage, a gate electrode coupled to the input node and a drain region coupled to the output node,
   wherein the second FET includes an n-channel FET that has a drain region coupled to the power supply voltage, a gate electrode coupled to the input node and a source region coupled to the output node,
   wherein the first FET and the second FET includes a dielectric layer including at least the ferroelectric,
   wherein the dielectric layer is formed between the gate electrode and an channel region that is formed between the drain region and the source region in a substrate, and
   wherein the dielectric layer further comprises a gate oxide layer which is interposed between the channel region and the ferroelectric.

4. The negative capacitance logic device of claim 1, wherein the negative capacitance logic device operates as a Schmitt-trigger inverter.

5. A clock generator comprising:
a spin torque oscillator configured to generate an oscillating signal having a first frequency in response to an applied direct current; and
a negative capacitance logic device configured to generate a clock signal toggling with the first frequency, in response to the oscillating signal,
wherein the spin toque oscillator comprises:
a first free layer;
a nonmagnetic layer disposed on the first free layer; and
a second free layer disposed on the nonmagnetic layer, the second free layer corresponding to the first free layer,
wherein the first free layer and the second free layer have perpendicular magnetic anisotropy or in-plane magnetic anisotropy.

6. The clock generator of claim 5, wherein the nonmagnetic layer is one of a conductive layer and an insulating layer and
wherein the first free layer and the second free layer have the same thickness.

7. The clock generator of claim 5, wherein the spin toque oscillator includes a magnetic tunnel junction (MTJ) structure, and wherein the MTJ structure comprises:
a pinned layer;
a tunnel layer disposed on the pinned layer; and
a free layer disposed on the tunnel layer.

8. The clock generator of claim 5, wherein the spin toque oscillator includes a giant magneto resistance (GMR) structure, and wherein the GMR structure comprises:
a pinned layer;
a nonmagnetic layer disposed on the pinned layer; and
a free layer disposed in the nonmagnetic layer.

9. The clock generator of claim 5, wherein the negative capacitance logic device comprises:
a first field effect transistor (FET) coupled between a power supply voltage and an output node, the first FET including a ferroelectric having a negative capacitance; and
a second (FET) coupled between the output node and a ground voltage, the second FET including a ferroelectric having a negative capacitance, and
wherein the negative capacitance logic is configured to differentiate the oscillating signal applied to an input node coupled to the spin torque oscillator to provide the clock signal at the output node.

10. The clock generator of claim 9, wherein the first FET includes a p-channel FET that has a source region coupled to the power supply voltage, a gate electrode coupled to the input node and a drain region coupled to the output node, and
wherein the second FET includes an n-channel FET that has a drain region coupled to the power supply voltage, a gate electrode coupled to the input node and a source region coupled to the output node.

11. The clock generator of claim 10, wherein each of the first FET and the second FET includes a dielectric layer including at least the ferroelectric, and
wherein the dielectric layer is formed between the gate electrode and an channel region that is formed between the drain region and the source region in a substrate.

* * * * *